United States Patent
Song et al.

(10) Patent No.: US 8,142,910 B2
(45) Date of Patent: Mar. 27, 2012

(54) ORGANIC LIGHT-EMITTING DEVICE

(75) Inventors: Won-Jun Song, Suwon-si (KR); Yeun-Joo Sung, Suwon-si (KR); Keon-Ha Choi, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 787 days.

(21) Appl. No.: 12/211,224

(22) Filed: Sep. 16, 2008

(65) Prior Publication Data

US 2009/0224656 A1 Sep. 10, 2009

(30) Foreign Application Priority Data

Mar. 4, 2008 (KR) .................. 10-2008-0020077

(51) Int. Cl.
*H01L 51/54* (2006.01)

(52) U.S. Cl. ......... 428/690; 428/917; 313/504; 313/506

(58) Field of Classification Search .................. None
See application file for complete search history.

(56) References Cited

U.S. PATENT DOCUMENTS

| | | | |
|---|---|---|---|
| 6,013,384 A | 1/2000 | Kido et al. | |
| 6,396,209 B1 | 5/2002 | Kido et al. | |
| 6,566,807 B1 * | 5/2003 | Fujita et al. | 313/506 |
| 7,195,829 B2 | 3/2007 | Cosimbescu et al. | |
| 7,297,417 B2 | 11/2007 | Kim et al. | |
| 7,750,560 B2 | 7/2010 | Yamazaki et al. | |
| 2002/0024293 A1 | 2/2002 | Igarashi et al. | |
| 2004/0178720 A1 | 9/2004 | Lee et al. | |
| 2004/0207318 A1 | 10/2004 | Lee et al. | |
| 2005/0037234 A1 * | 2/2005 | Kim et al. | 428/690 |
| 2005/0062406 A1 | 3/2005 | Kinoshita | |
| 2005/0106413 A1 * | 5/2005 | Tanaka et al. | 428/690 |
| 2005/0221119 A1 | 10/2005 | Cosimbescu et al. | |

(Continued)

FOREIGN PATENT DOCUMENTS

CN 1261760 A 8/2000

(Continued)

OTHER PUBLICATIONS

Extended European Search Report dated Feb. 11, 2009, issued in corresponding European Patent Application No. 08253275.5.

(Continued)

*Primary Examiner* — Dawn L. Garrett
(74) *Attorney, Agent, or Firm* — Robert E. Bushnell, Esq.

(57) ABSTRACT

An organic light-emitting device includes a first electrode; a second electrode; an emissive layer disposed between the first electrode and the second electrode; and a hole injecting layer disposed between the first electrode and the second electrode. The hole injecting layer includes a three-component mixture of a metal fluoride, an insulator, and a hole injecting layer forming organic compound. The metal of the metal fluoride is a Group 1 or Group 2 element. The insulator is a compound made up of an element selected from the group consisting of Li, Na, K, Rb, Cs, Be, Mg, Ca, Sr, Ba and B, and an element selected from the group consisting of O, S, Cl, Se, Br and I. The hole injecting layer material provides excellent electrical characteristics, and is suitable for fluorescent and phosphorescent devices of all colors including red, green, blue, and white, and can be used in manufacturing an organic light-emitting device having high efficiency, low voltage, high brightness, and long life span.

18 Claims, 6 Drawing Sheets

U.S. PATENT DOCUMENTS

| | | |
|---|---|---|
| 2006/0008670 A1 | 1/2006 | Lin et al. |
| 2006/0008740 A1 | 1/2006 | Kido et al. |
| 2006/0214553 A1 | 9/2006 | Nagara et al. |
| 2006/0279190 A1 | 12/2006 | Nakayama |
| 2006/0286405 A1 | 12/2006 | Begley et al. |
| 2006/0292394 A1 | 12/2006 | Iwaki et al. |
| 2007/0020483 A1 | 1/2007 | Park et al. |
| 2007/0075637 A1 | 4/2007 | Kim et al. |
| 2007/0090756 A1 | 4/2007 | Okada et al. |
| 2007/0126348 A1 | 6/2007 | Iou |
| 2007/0150206 A1 | 6/2007 | Iwaki et al. |
| 2007/0170843 A1 | 7/2007 | Kawamura et al. |
| 2007/0181876 A1 | 8/2007 | Itai |
| 2007/0210303 A1 | 9/2007 | Ikeda et al. |
| 2007/0222376 A1 | 9/2007 | Ohsawa et al. |
| 2008/0252199 A1 | 10/2008 | Yamazaki et al. |
| 2009/0128024 A1 | 5/2009 | Fukuoka et al. |
| 2009/0167159 A1 | 7/2009 | Song et al. |
| 2009/0167160 A1 | 7/2009 | Song et al. |
| 2009/0212688 A1 | 8/2009 | Song et al. |
| 2009/0218934 A1 | 9/2009 | Song et al. |

FOREIGN PATENT DOCUMENTS

| | | |
|---|---|---|
| CN | 1781340 A | 5/2006 |
| CN | 101036246 A | 9/2007 |
| EP | 1 603 174 | 12/2005 |
| EP | 1 617 493 | 1/2006 |
| EP | 1 631 125 | 3/2006 |
| EP | 1 748 504 | 1/2007 |
| EP | 1 748 505 | 1/2007 |
| JP | 10270172 A | 10/1998 |
| JP | 2000-182774 | 6/2000 |
| JP | 2000-215984 | 8/2000 |
| JP | 2003-264083 | 9/2003 |
| JP | 2004-172149 | 6/2004 |
| JP | 2004-296403 | 10/2004 |
| JP | 2004-319424 | 11/2004 |
| JP | 2004-355975 | 12/2004 |
| JP | 2006-24791 | 1/2006 |
| JP | 2006-114521 | 4/2006 |
| JP | 2006-128097 | 5/2006 |
| JP | 2006-156344 | 6/2006 |
| JP | 2006-269819 | 10/2006 |
| JP | 2007-5784 | 1/2007 |
| JP | 2007-36175 | 2/2007 |
| JP | 2007-134677 | 5/2007 |
| JP | 2007-208217 | 8/2007 |
| JP | 2007-287676 | 11/2007 |
| JP | 2007-531316 | 11/2007 |
| KR | 1999-0031395 | 5/1999 |
| KR | 10-0263754 | 5/2000 |
| KR | 2005-15902 | 2/2005 |
| KR | 10-2005-0115472 | 12/2005 |
| KR | 2006-7899 | 1/2006 |
| KR | 2006-42177 | 5/2006 |
| KR | 10-2006-0133521 | 12/2006 |
| KR | 10-2006-0135801 | 12/2006 |
| KR | 10-0672535 | 1/2007 |
| KR | 2007-0013002 | 1/2007 |
| KR | 10-0698300 | 3/2007 |
| KR | 2007-71978 | 7/2007 |
| KR | 2007-0077617 | 7/2007 |
| KR | 2007-0117200 | 12/2007 |
| WO | WO 2004/028217 | 4/2004 |
| WO | WO 2006/109878 | 10/2006 |
| WO | WO 2007/123061 | 11/2007 |

OTHER PUBLICATIONS

Korean Office Action dated Apr. 24, 2009, issued in corresponding Korean Patent Application No. 10-2007-0116759.
Japanese Office Action dated Sep. 7, 2010, issued in corresponding Japanese Application No. 2007-278415.
Japanese Office Action dated Mar. 2, 2010, issued in Japanese Patent Application No. 2008-249204.
U.S. Appl. No. 12/133,802, filed Jun. 5, 2008, Song, Won-jun, Samsung SDI Co., Ltd.
U.S. Appl. No. 12/133,744, filed Jun. 5, 2008, Song, Won-jun, Samsung SDI Co., Ltd.
U.S. Appl. No. 12/133,824, filed Jun. 5, 2008, Song, Won-jun, Samsung SDI Co., Ltd.
U.S. Appl. No. 12/133,843, filed Jun. 5, 2008, Song, Won-jun, Samsung SDI Co., Ltd.
U.S. Appl. No. 12/211,233, filed Sep. 16, 2008, Song, Won-jun, Samsung SDI Co., Ltd.
Walzer, K. et al, "Highly Efficient Organic Devices Based on Electrically Doped Transport Layers." *Chemical Reviews, American Chemical Society.* vol. 107. pp. 1233-1271. Jan. 1, 2007.
Office Action issued in corresponding Korean Patent Application No. 2008-6472618 dated Dec. 29, 2008.
Extended European Search Report issued by the European Patent Office on Jan. 28, 2009.
Korean Registration Determination Certificate issued by the Korean Intellectual Property Office on Mar. 13, 2009.
Communication issued by the European Patent Office on Apr. 29, 2009.
Registration Determination Certificate in corresponding Korean Patent Application No. 10-2007-0136406 dated Aug. 19, 2009.
US Office Action dated Aug. 19, 2010, issued in co-pending U.S. Appl. No. 12/133,712.
Japanese Office Action dated Sep. 28, 2010, issued in corresponding Japanese Application No. 2008-270210.
Japanese Office Action dated Sep. 28, 2010, issued in corresponding Japanese Application No. 2008-276076.
U.S. Appl. No. 12/133,712, filed Jun. 5, 2008, Won-Jun Song et al., Samsung Mobile Display Co., Ltd.
Office Action issued in related U.S. Appl. No. 12/133,802 on Apr. 5, 2010.
Office Action issued in related U.S. Appl. No. 12/133,824 on Jul. 9, 2010.
Office Action issued in related U.S. Appl. No. 12/133,843 on Jul. 12, 2010.
Office Action issued in related U.S. Appl. No. 12/133,744 on Jul. 15, 2010.
Registration Determination Certificate issued by the Korean Intellectual Property Office on Apr. 28, 2009.
Registration Determination Certificate issued Sep. 29, 2009, for corresponding Korean Patent Application No. 2009-040241095.
Registration Determination Certificate issued Sep. 30, 2009, for corresponding Korean Patent Application No. 2009-040783883.
Japanese Office Action issued by Japanese Patent Office on Jun. 14, 2011, corresponding to Japanese Patent Application No. 2008-271210 and Request for Entry of the Accompanying Office Action attached herewith. (Cited in the cross-referenced U.S. Appl. No. 12/133,843 in the Information Disclosure Statement filed on Aug. 29, 2011.).
Chinese Office Action issued by Chinese Patent Office on Aug. 24, 2011, corresponding to Chinese Patent Application No. 200810184444.X and Request for Entry attached herewith.

\* cited by examiner

ORGANIC LIGHT-EMITTING DEVICE

CROSS-REFERENCE TO RELATED APPLICATION

This application claims the benefit of Korean Application No. 2008-20077, filed Mar. 4, 2008, in the Korean Intellectual Property Office, the disclosure of which is incorporated herein by reference.

BACKGROUND OF THE INVENTION

1. Field of the Invention

Aspects of the present invention relates to an organic light-emitting device, and more particularly, to an organic light-emitting device with improved light-emitting efficiency and life span.

2. Description of the Related Art

An organic light-emitting device (OLED) is a self-emitting device including two electrodes and an organic film inserted between the two electrodes. When a current is applied to the device, the OLED emits light by the recombination of electrons and holes in the organic film. Accordingly, OLEDs are advantageous in terms of providing a lightweight thin information display device having a high image quality, fast response time, and wide viewing angle. Such characteristics have been a driving force in the dramatic growth of OLED technology. Currently OLEDs are used not just in mobile phones, but in a wide range of applications including various information display devices.

Such a significant growth in OLED technology has made competition with other information display devices such as TFT-LCDs inevitable, not just in the academic field, but also in industry. Thus, conventional OLEDs are facing a technological challenge, requiring improvements in efficiency and life span, and reduction of power consumption thereof.

SUMMARY OF THE INVENTION

Aspects of the present invention provide an organic light-emitting device with high efficiency, low voltage, high brightness, and long life span, which uses an organic film including a novel hole injecting material with excellent electrical characteristics and suitable for fluorescent and phosphorescent devices of all colors including red, green, blue, and white.

According to an embodiment of the present invention, there is provided an organic light-emitting device including: a first electrode; a second electrode; an emissive layer disposed between the first electrode and the second electrode; and a hole injecting layer disposed between the first electrode and the second electrode, wherein the hole injecting layer includes a three-component mixture including a metal fluoride, an insulator, and a hole injecting layer forming organic compound, wherein the metal of the metal fluoride is a Group 1 or Group 2 element, and the insulator is a compound including an element selected from the group consisting of Li, Na, K, Rb, Cs, Be, Mg, Ca, Sr, Ba and B, and an element selected from the group consisting of O, S, Cl, Se, Br and I.

According to an aspect of the present invention, a molar mix ratio between a mixture of the metal fluoride and the insulator and the hole injecting layer forming organic compound may be 1:1 to 1:3.

According to another aspect of the present invention, a molar mix ratio between the metal fluoride and the insulator is 1:2 to 2:1.

According to another embodiment of the present invention, there is provided a hole injecting layer of an organic light-emitting device comprising a three-component mixture comprising a metal fluoride, an insulator, and a hole injecting layer forming organic compound, wherein the metal of the metal fluoride is a Group 1 or Group 2 element, and the insulator is a compound comprising an element selected from the group consisting of Li, Na, K, Rb, Cs, Be, Mg, Ca, Sr, Ba and B, and an element selected from the group consisting of O, S, Cl, Se, Br and I.

The hole injecting layer material according to aspects of the present invention provides excellent electrical characteristics and is suitable for fluorescent and phosphorescent devices of all colors including red, green, blue, and white, which can be used to produce an organic light-emitting device with high efficiency, low voltage, high brightness, and long life span.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
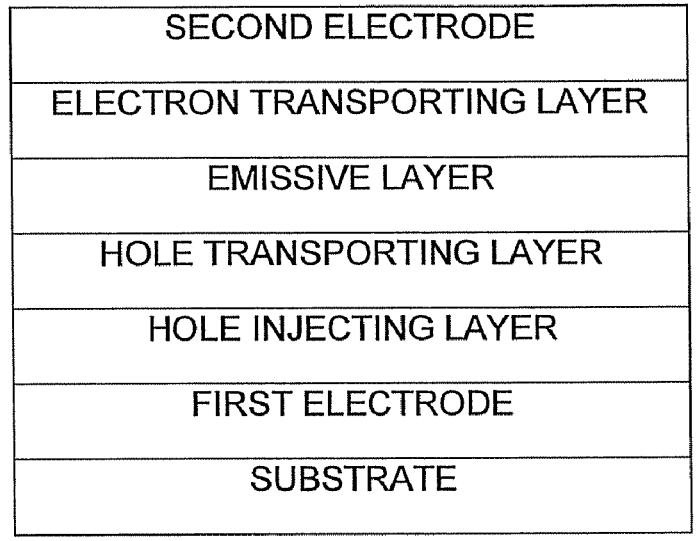
FIGS. 1A to 1C are cross-sectional diagrams schematically illustrating structures of organic light-emitting devices according to embodiments of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Aspects of the present invention provide an organic light-emitting device including a first electrode; a second electrode; an emissive layer (EML) disposed between the first electrode and the second electrode; and a hole injecting layer (HIL) disposed between the first electrode and the second electrode, wherein the HIL includes a three-component mixture of a metal fluoride, an insulator, and an HIL forming organic compound. Hereinafter, each component of the three-component mixture will be described more fully.

The metal of the metal fluoride may be a Group 1 or a Group 2 element. For example, the metal fluoride may be LiF, NaF, $CaF_2$, $MgF_2$, or CsF.

The insulator may be a compound including an element selected from the group consisting of Li, Na, K, Rb, Cs, Be, Mg, Ca, Sr, Ba, W and B, and an element selected from the group consisting of O, S, Cl, Se, Br and I. For example, the insulator may be barium oxide, boron oxide, molybdenum oxide, tungsten oxide, or nickel oxide.

Meanwhile, the HIL forming organic compound may be a compound that is conventionally used in the art as an HIL forming material. Examples of the HIL-forming organic compound include copper phthalocyanine, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine (TCTA), 4,4',4''-tris(3-methylphenylamino)triphenylamine (m-MTDATA), 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalen-1-yl)-N,N'-diphenyl benzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine) (TFB) and poly(9,9-dioctylfluorene-co-bis-N,N-phenyl-1,4-phenylenediamine) (PFB).

Conventionally, materials used in order to reduce the hole injecting barrier have been pure organic base materials designed to minimize the energy gap between the first electrode and the organic material. However, when the HIL including the insulator according to aspects of the present invention is used at an electrode interface, the energy trap distribution present in the organic structure can be reduced, and the surface morphology can be improved to lower contact resistance and prevent charge accumulation.

In addition, when the HIL including the metal fluoride according to aspects of the present invention is used at the electrode interface, a dipole moment is produced at the electrode interface, and such dipoles enable a more organic injection of holes upon application of an electrical field to the organic light-emitting device (induced dipole).

As a non-limiting example, the molar mix ratio of the mixture of the metal fluoride and the insulator to the HIL forming organic compound may be 1:1 to 1:3. If the mix ratio is less than 1:1, the driving voltage reducing effect may be insignificant, and if the mix ratio is greater than 3:1, the driving voltage may increase.

As a non-limiting example, the molar mix ratio between the metal fluoride and the insulator may be 1:2 to 2:1. If the mix ratio is less than 1:2 such that the amount of the metal fluoride included in the HIL is small, the driving voltage decrease may be diminished, and if the mix ratio is greater than 2:1 such that the amount of the HIL forming organic compound is excessive, the voltage may increase.

The metal fluoride and the insulator may be manufactured using a variety of conventional methods well known to one of ordinary skill in the art.

The organic light-emitting device including an HIL according to an embodiment of the present invention provides improved driving voltage, light-emitting efficiency, and life span characteristics, and particularly the reduction of life span in minimized in the case of digital driving (constant voltage driving).

Figure 2:
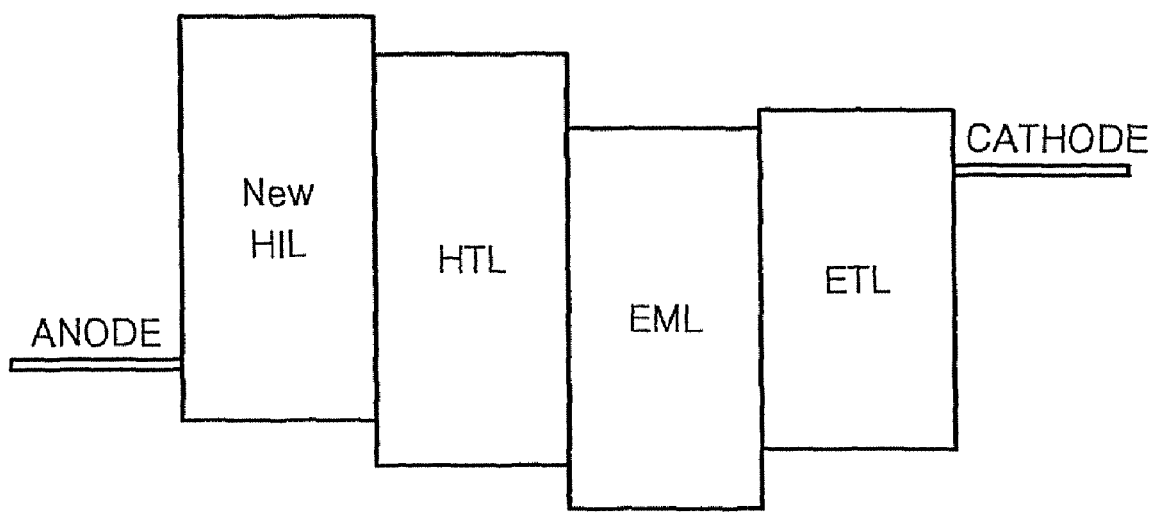
FIG. 2 is an energy band diagram schematically illustrating the difference between HOMO levels and LUMO levels of each of a plurality of layers of an organic light-emitting device according to another embodiment of the present invention.

FIG. 2 is an energy band diagram schematically illustrating the difference between the highest occupied molecular orbital (HOMO) levels and lowest unoccupied molecular orbital (LUMO) levels of each of a plurality of layers of an organic light-emitting device according to an embodiment of the present invention.

The organic light-emitting device according to aspects of the present invention can reduce the charge injecting barrier, and also increase the life span while driving, by reducing the contact resistance of interfaces between a first electrode and the HIL.

Figure 1B:
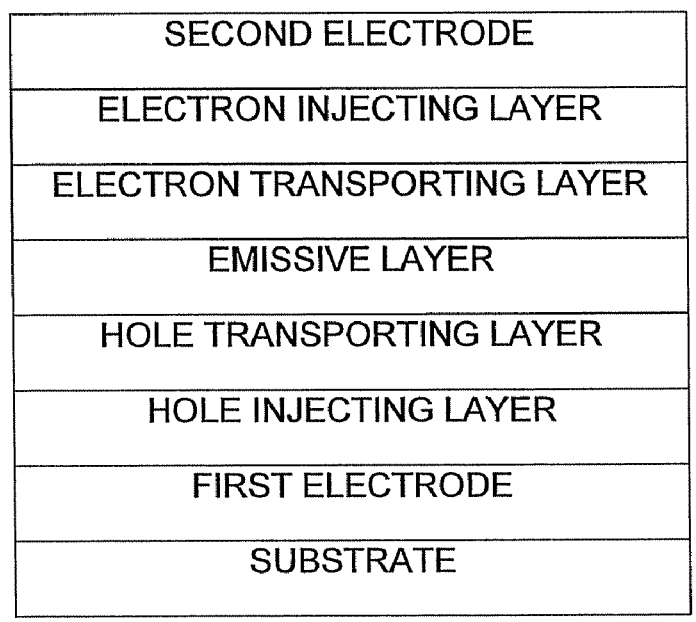
Figure 1C:
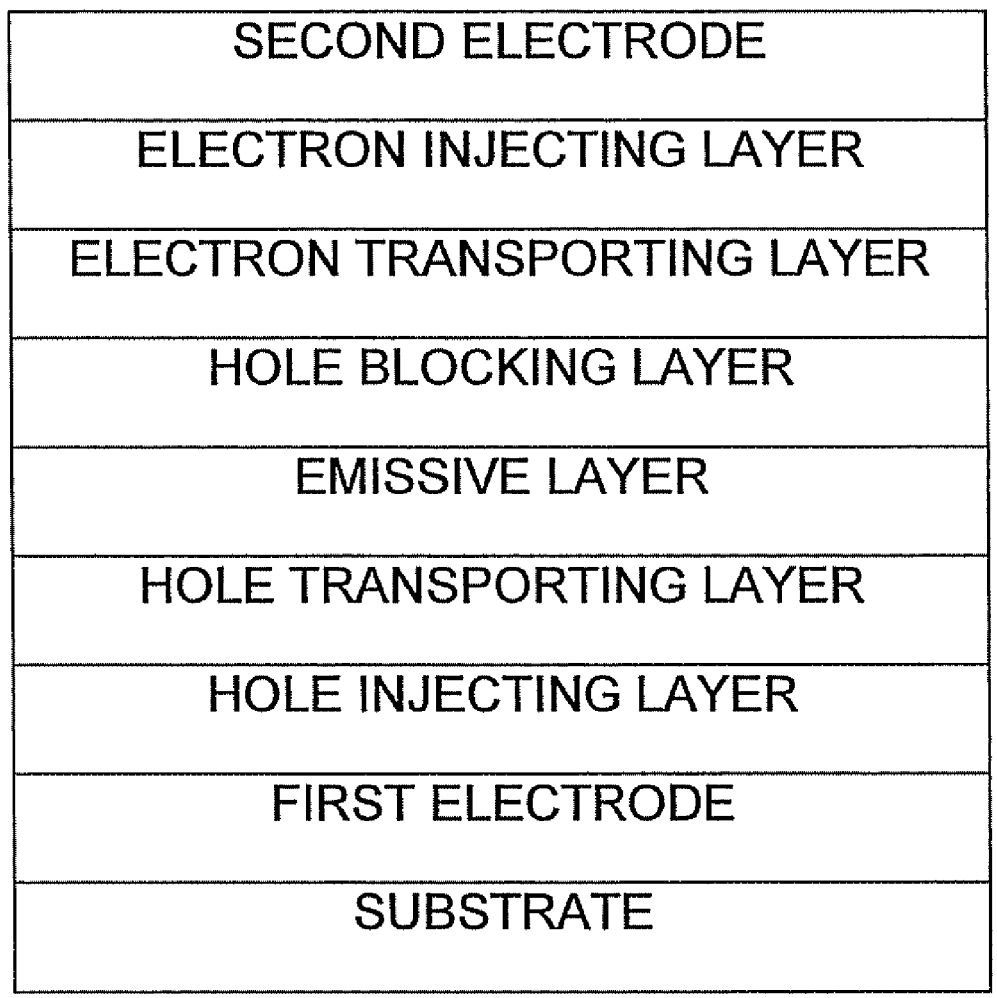

The organic light-emitting device according to aspects of the present invention may have a variety of structures as illustrated in FIGS. 1A to 1C, and a single or double-layered intermediate layer may further be formed when necessary.

Hereinafter, a method of manufacturing an organic light-emitting device according to an embodiment of the present invention will be described.

First, a first electrode is formed by depositing a first electrode material having a high work function on a substrate through deposition or sputtering. The first electrode may be an anode. The substrate used may be a substrate conventionally used in organic light-emitting devices, and may preferably be a glass substrate or a transparent plastic substrate having excellent mechanical strength, thermal stability, transparency, surface planarity, ease of handling, and water resistance. Alternatively, the first electrode material may be indium tin oxide (ITO), indium zinc oxide (IZO), tin oxide ($SnO_2$), or zinc oxide (ZnO), which are transparent and highly conductive.

Next, an HIL is formed on the first electrode, using a method such as vacuum deposition, spin coating, casting, or Langmuir-Blodgett (LB) deposition. The HIL may be formed by co-depositing a metal fluoride, which is an HIL material, an insulator, and a well-known HIL-forming organic compound on the first electrode.

When forming the HIL by vacuum deposition, the deposition conditions may vary depending on the materials used for the HIL, the structure of the HIL to be formed, and its thermal properties, but generally the deposition conditions may be appropriately selected from the ranges of a deposition temperature of 50 to 500° C., a degree of vacuum of $10^{-8}$ to $10^{-3}$ torr, a deposition rate of 0.01 to 100 Å/sec, and a film thickness of 10 Å to 5 μm.

Next a hole transporting layer (HTL) is formed on the HIL using a well-known method such as vacuum deposition, spin coating, casting, or LB deposition. If the HTL is formed using vacuum deposition or spin coating, the deposition conditions and the coating conditions may be vary depending on the material used to form the HTL, but may be generally selected from the range of conditions used to form the HIL.

The HTL material may be appropriately selected from well-known materials used for HTLs. For example, the HTL material may be carbazole derivatives such as N-phenylcarbazole, polyvinylcarbazole, or conventional amine derivatives having an aromatic condensed ring such as N,N'-bis(3-methylphenyl)-N,N'-diphenyl-[1,1-biphenyl]-4,4'-diamine (TPD), and N,N'-di(naphthalene-1-yl)-N,N'-diphenyl benzidine (α-NPD).

An emissive layer (EML) is formed on the HTL. The material used to form the EML is not particularly limited. The EML material may include a conventional host material and a dopant material.

A red (R) portion of the EML may include, for example, DCM1, DCM2, Eu (thenoyltrifluoroacetone)$_3$ (Eu(TTA)$_3$), or butyl-6-(1,1,7,7-tetramethyl julolidyl-9-enyl)-4H-pyran (DCJTB). A variety of modifications are possible. For example, dopants such as DCJTB may be doped on Alq3, Alq3 and rubrene may be co-deposited and the dopant may be doped thereon, or dopants such as BTPIr or RD 61 may be doped on 4,4'-N,N'-dicarbazole-biphenyl (CBP).

A green (G) portion of the EML may include, for example, Coumarin 6, C545T, quinacridones, or Ir(ppy)$_3$. Meanwhile, various modifications are possible. For example, Ir(ppy)$_3$ may be used as a dopant on CBP, or Alq3 may be used as a host and a coumarin-based material may be used as a dopant. Particular examples of the coumarin-based material include C314S, C343S, C7, C7S, C6, C6S, C314T, and C545T.

A blue (B) portion of the EML may include, for example, oxadiazole dimer dyes (Bis-DAOPXP), spiro compounds (Spiro-DPVBi, Spiro-6P), triarylamine compounds, bis (styryl)amine (DPVBi, DSA), FIrPic, CzTT, anthracene, TPB, PPCP, DST, TPA, OXD-4, BBOT, AZM-Zn, and BH-013X (Idemitsu Co.) which is an aromatic hydrocarbon compound containing a naphthalene moiety. Various modifications are possible. For example, IDE105 (product name, Idemitsu Co.) may be used as a dopant on IDE140 (product name, Idemitsu Co.).

The thickness of the EML may be 200 to 500 Å, or more specifically, 300 to 400 Å. Meanwhile, the thicknesses of the R, G and B portions of the EML may be the same or different. If the thickness of the EML is less than 200 Å, the life span of the organic light emitting device may be shortened, and if the thickness of the EML is greater than 500 Å, the increasing rate of the driving voltage becomes too high.

The EML may be formed using a conventional method such as vacuum deposition, spin coating, casting, or LB deposition. If the EML is formed using vacuum deposition or spin coating, the deposition or coating conditions may vary depending on the compound used to form the EML, but may generally be selected from the range of conditions used to form the HIL.

A hole blocking material may be vacuum deposited or spin coated on the EML to selectively form a hole blocking layer (HBL). The HBL forming material is not particularly limited, but the material should have an electron transporting ability and a higher ionizing potential than a light-emitting compound. Non-limiting examples of the HBL forming material may include bis(2-methyl-8-quinolato)-(p-phenylphenolato)-aluminum (Balq), bathocuproine (BCP), and tris(N-aryl benzimidazole) (TPBI).

The thickness of the HBL may be 30 to 60 Å, or more specifically, 40 to 50 Å. If the thickness of the HBL is less than 30 Å, the hole blocking characteristics may not be sufficient, and if the thickness of the HBL is greater than 50 Å, the driving voltage may be increased.

The HBL may be formed using a conventional method such as vacuum deposition, spin coating, casting, or LB deposition. If the HBL is formed using vacuum deposition or spin coating, the deposition or coating conditions may vary depending on the compound used to form the HBL, but may generally be selected from the range of conditions used to form the HIL.

An electron transporting material is vacuum-deposited or spin coated on the EML or the HBL to selectively form an electron transporting layer (ETL). The electron transporting material is not particularly limited. For example, Alq3 or the like may be used.

The thickness of the ETL may be 100 to 400 Å, or more specifically, 250 to 350 Å. If the thickness of the ETL is less than 100 Å, the electron transporting rate is excessive such that the charge balance may be disrupted, and if the thickness of the ETL is greater than 400 Å, the driving voltage may be increased.

The ETL may be formed using a conventional method such as vacuum deposition, spin coating, casting, or LB deposition. If the ETL is formed using vacuum deposition or spin coating, the deposition or coating conditions may vary depending on the compound used to form the ETL, but may generally be selected from the range of conditions used to form the HIL.

An electron injecting layer (EIL) is formed on the EML, HBL, or the ETL, by vacuum deposition or spin coating. The EIL forming material may be a material such as BaF$_2$, LiF, NaCl, CsF, Li$_2$O, BaO, or lithium quinolate (Liq), but is not limited thereto.

The thickness of the EIL may be 2 to 10 Å, or more specifically, 2 to 5 Å, or most specifically, 2 to 4 Å. If the thickness of the EIL is less than 2 Å, then the EIL may not function effectively, and if the thickness of the EIL is greater than 10 Å, the driving voltage may be increased.

The EIL may be formed using a conventional method such as vacuum deposition, spin coating, casting, or LB deposition. If the ETL is formed using vacuum deposition or spin coating, the deposition or coating conditions may vary depending on the compound used to form the EIL, but may generally be selected from the range of conditions used to form the HIL.

Next, a second electrode-forming material is deposited on the EIL to form a second electrode, thereby completing the manufacture of an organic light-emitting device.

The second electrode-forming material may include indium tin oxide (ITO), indium zinc oxide (IZO), tin oxide (SnO$_2$), or zinc oxide (ZnO), which are transparent and highly conductive metal oxides. Alternatively, Li, Mg, Al, Al—Li, Ca, Mg—In, Mg—Ag, Ca, and Al may be used for forming a thin film to form a second electrode that is reflective, semitransparent, or transparent. The second electrode-forming material is not limited to the metal or a combination of the metals described above.

The first electrode and the second electrode may function as an anode and a cathode respectively, and the reverse is also possible.

Hereinafter, aspects of the present invention will be described in more detail with reference to the following examples. However, these examples are for illustrative purposes only and are not intended to limit the scope of the invention.

EXAMPLE 1

An anode was prepared by cutting a Corning 15 Ωcm$^2$ (1200 Å) ITO glass substrate into a size of 50 mm×50 mm×0.7 mm, and sonicating for 5 minutes using isopropyl alcohol and deionized water, then irradiating with UV light for 30 minutes and exposing the substrate to ozone to clean the substrate.

MgF$_2$, B$_2$O$_3$ and NPB were co-deposited on the anode to form an HIL having a thickness of 50 Å.

Next, 4,4'-bis[N-(1-naphthyl)-N-phenylamino]biphenyl (NPB) was vacuum-deposited as a hole transporting compound on the HIL to form a HTL having a thickness of 300 Å.

A well known green fluorescent host, Alq3, and a dopant, Coumarin (C545T), were deposited on the HTL to form an EML having a thickness of 200 Å.

Next, Alq$_3$ was deposited on the EML to form an ETL having a thickness of 300 Å, an EIL was formed on the ETL by depositing a halogenated alkaline metal, LiF, on the ETL to a thickness of 10 Å, and Al was vacuum deposited to a thickness of 3000 Å on the EIL to form a LiF/Al electrode, thereby completing the manufacture of an organic light-emitting device.

Comparative Example

An organic light-emitting device was manufactured using the same method as in Example, except that the HIL was formed using only IDE406 (Idemitsu Co.).

Evaluation Example 1

Figure 3:
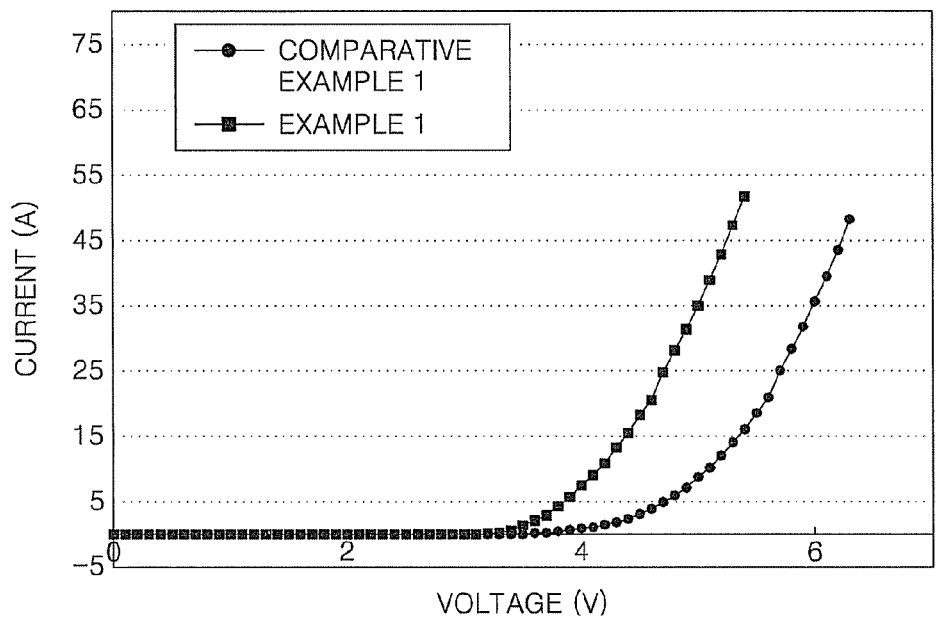
FIG. 3 is a graph illustrating the current densities of an organic light-emitting device according to Example 1 and Comparative Example 1, respectively.
Figure 4:
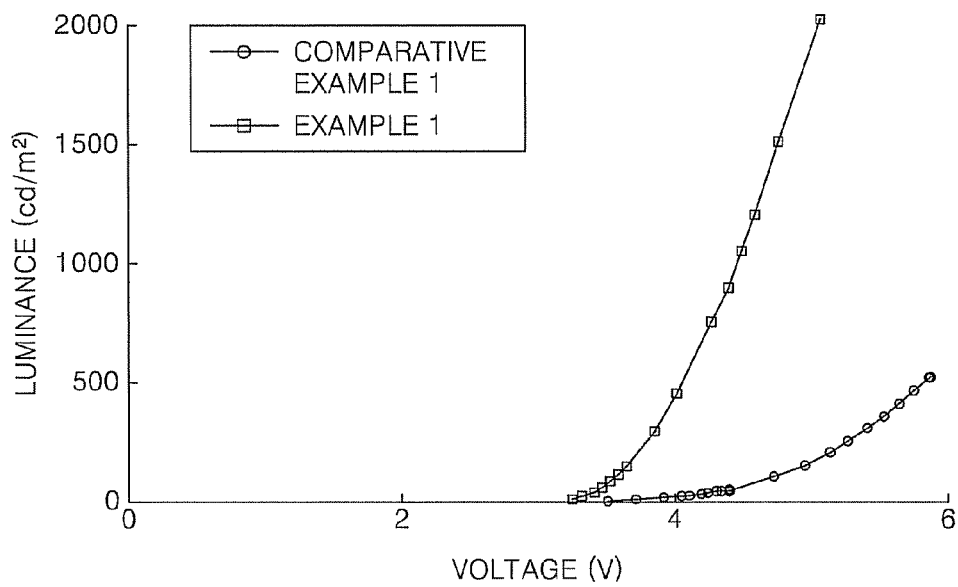
FIG. 4 is a graph illustrating the brightness characteristics of an organic light-emitting device according to Example 1 and Comparative Example 1, respectively.
Figure 5:
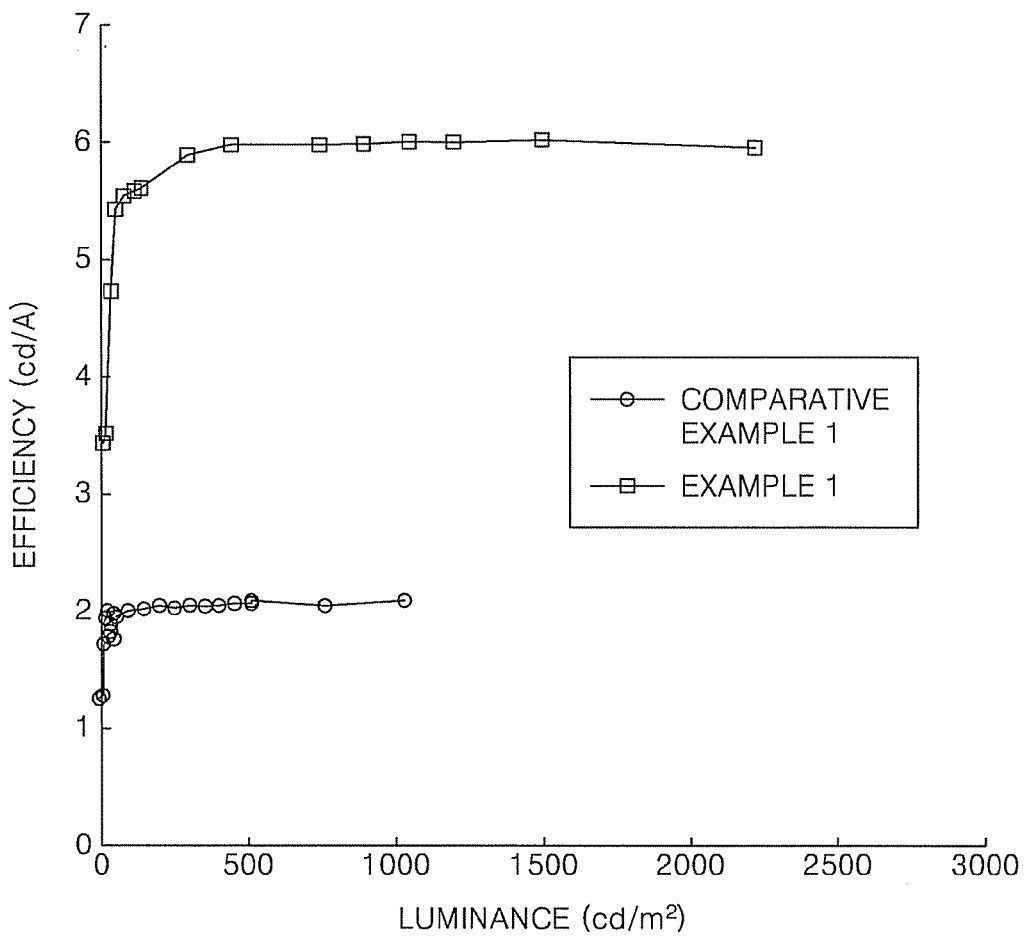
FIG. 5 is a graph illustrating the efficiency characteristics of an organic light-emitting device according to Example 1 and Comparative Example 1, respectively.
Figure 6:
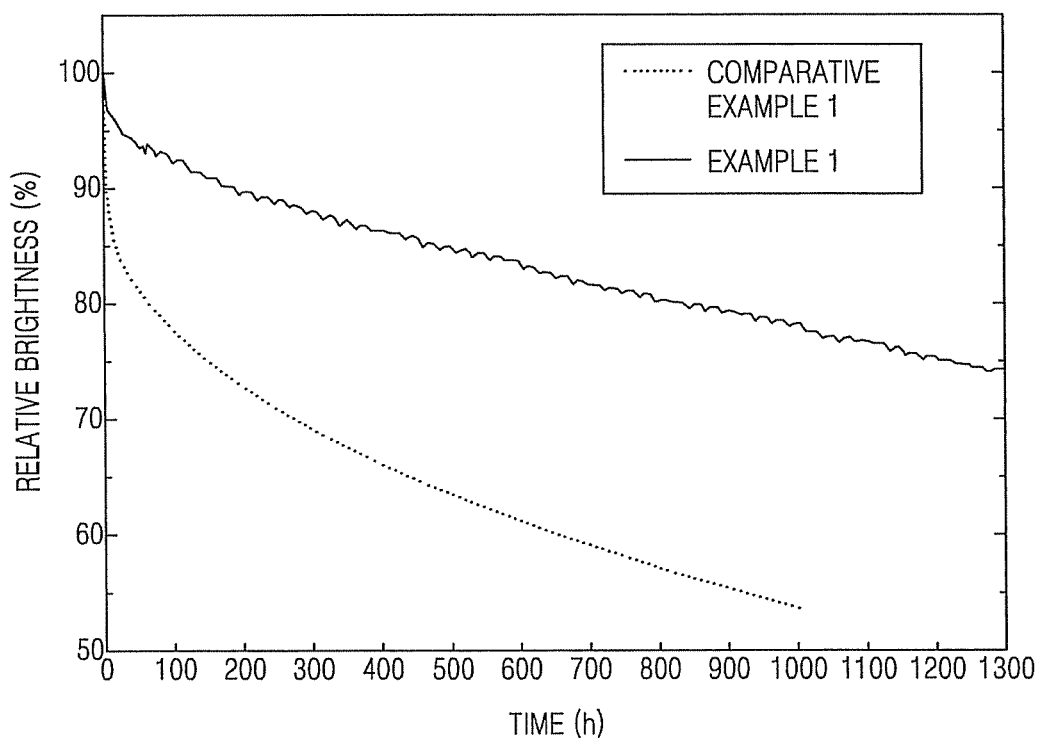
FIG. 6 is a graph illustrating the brightness characteristics of an organic light-emitting device according to Example 1 and Comparative Example 1, respectively, with respect to time.

Current densities, brightness characteristics, and efficiency characteristics were evaluated for the Example 1 and the Comparative Example 1. FIGS. 3 to 5 are graphs illustrating the data for each of the characteristics. A Source Measurement Unit 238 (Keithley Co.) was used for the evaluation of the current densities, and a PR650 LMS was used for measuring the brightness and efficiency. As shown in FIGS. 3 to 5, the organic light emitting device according to the Example 1 provided a reduced driving voltage for a given current, a greater luminance for a given voltage, and a greater efficiency for a given luminance, in comparison to the Comparative Example 1.

By using the HIL-forming material according to aspects of the present invention, charge injecting characteristics are enhanced, the driving voltage of the organic light emitting device can be reduced at the same current, and the current efficiency is improved. Thus, the brightness as well as the life span of the organic light emitting device according to the present invention is increased compared with the prior art.

As previously described, the HIL-forming material according to aspects of the present invention provides excellent electrical characteristics, and is suitable for fluorescent and phosphorescent devices of all colors including red, green, blue, and white, and can be used in manufacturing an organic light-emitting device having high efficiency, low voltage, high brightness, and long life span.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light-emitting device, comprising:
a first electrode;
a second electrode;
an emissive layer arranged between the first electrode and the second electrode; and
a hole injecting layer arranged between the first electrode and the second electrode, wherein the hole injecting layer comprises a three-component mixture comprising a metal fluoride, an insulator, and a hole injecting layer forming organic compound, wherein the metal of the metal fluoride is a Group 1 or Group 2 element, and the insulator being one of molybdenum oxide, nickel oxide, barium oxide, tungsten oxide, caesium oxide, $Rb_2O$, SrO, $SrCl_2$, $BaCl_2$, $BCl_3$ or a compound comprising an element selected from the group consisting of Li, Na, K, Rb, Cs, Be, Mg, Ca, Sr, Ba and B, and an element selected from the group consisting of S, Cl, Se, Br and I, wherein the hole injecting layer forming organic compound is selected from a group consisting of copper phthalocyanine, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 1,3,5-tri(2-carbazolylphenyl)benzene, 1,3,5-tris(2-carbazolyl-5-methoxyphenyl)benzene, bis(4-carbazolylphenyl)silane and N,N'-di(naphthalen-1-yl)-N,N'-diphenylbenzidine (α-NPD).

2. The organic light-emitting device of claim 1, wherein a molar mix ratio between a mixture of the metal fluoride and the insulator, and the hole injecting layer forming organic compound is 1:1 to 1:3.

3. The organic light-emitting device of claim 1, wherein a molar mix ratio between the metal fluoride and the insulator is 1:2 to 2:1.

4. The organic light-emitting device of claim 1, wherein the metal fluoride is one of LiF, NaF, $CaF_2$, $MgF_2$ and CsF.

5. The organic light-emitting device of claim 1, wherein the insulator is one of molybdenum oxide, tungsten oxide or nickel oxide.

6. The organic light-emitting device of claim 1, further comprising at least one layer selected from the group consisting of a hole transporting layer, an electron blocking layer, a hole blocking layer, an electron transporting layer, and an electron injecting layer.

7. The organic light-emitting device of claim 6, wherein the device has one of the following structures:
first electrode/hole injecting layer/hole transporting layer/emissive layer/electron transporting layer/second electrode,
first electrode/hole injecting layer/hole transporting layer/emissive layer/electron transporting layer/electron injecting layer/second electrode; or
first electrode/hole injecting layer/hole transporting layer/emissive layer/hole blocking layer/electron transporting layer/electron injecting layer/second electrode.

8. A hole injecting layer of an organic light-emitting device, comprising:
a three-component mixture comprising a metal fluoride, an insulator, and a hole injecting layer forming organic compound, wherein the metal of the metal fluoride is a Group 1 or Group 2 element, the insulator being one of molybdenum oxide, nickel oxide, tungsten oxide, barium oxide, caesium oxide, $Rb_2O$, SrO, $SrCl_2$, $BaCl_2$, $BCl_3$, or a compound comprising an element selected from the group consisting of Li, Na, K, Rb, Cs, Be, Mg, Ca, Sr, Ba and B, and an element selected from the group consisting of S, Se, Br and I, and the hole injecting layer forming organic compound being selected from a group consisting of copper phthalocyanine, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 1,3,5-tri(2-carbazolylphenyl)benzene, 1,3,5-tris(2-carbazolyl-5-methoxyphenyl)benzene, bis(4-carbazolylphenyl)silane and N,N'-di(naphthalen-1-yl)-N,N'-diphenyl benzidine (α-NPD).

9. The hole injecting layer of claim 8, wherein a molar mix ratio between a mixture of the metal fluoride and the insulator, and the hole injecting layer forming organic compound is 1:1 to 1:3.

10. The hole injecting layer of claim 8, wherein a molar mix ratio between the metal fluoride and the insulator is 1:2 to 2:1.

11. The hole injecting layer of claim 8, wherein the metal fluoride is one of LiF, NaF, $CaF_2$, $MgF_2$ and CsF.

12. The hole injecting layer of claim 8, wherein the insulator is one of molybdenum oxide, tungsten oxide, or nickel oxide.

13. An organic light-emitting device, comprising:
a first electrode;
a second electrode;
an emissive layer arranged between the first electrode and the second electrode; and
a hole injecting layer arranged between the first electrode and the second electrode, wherein the hole injecting layer comprises a three-component mixture comprising a metal fluoride, an insulator, and a hole injecting layer forming organic compound, wherein the metal of the metal fluoride is a Group 1 or Group 2 element, and the insulator is a compound selected from a group consisting of molybdenum oxide, tungsten oxide, nickel oxide, caesium oxide, $SrCl_2$, $BaCl_2$, $BCl_3$, $Rb_2O$, SrO and BaO.

14. The organic light-emitting device of claim 13, wherein a molar mix ratio between a mixture of the metal fluoride and the insulator, and the hole injecting layer forming organic compound is 1:1 to 1:3.

15. The organic light-emitting device of claim 13, wherein a molar mix ratio between the metal fluoride and the insulator is 1:2 to 2:1.

16. The organic light-emitting device of claim 13, wherein the metal fluoride is one of $SrF_2$ or $BaF_2$.

17. The organic light-emitting device of claim 13, the hole injecting layer having a thickness in the range of 10 Å to 5 μm.

18. The organic light-emitting device of claim 13, wherein the hole injecting layer forming organic compound is selected from a group consisting of copper phthalocyanine, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 1,3,5-tri(2-carbazolylphenyl)benzene, 1,3,5-tris(2-carbazolyl-5-methoxyphenyl)benzene, bis(4-carbazolylphenyl)silane and N,N'-di(naphthalen-1-yl)-N,N'-diphenyl benzidine (α-NPD).

* * * * *